(12) United States Patent
Thompson et al.

(10) Patent No.: US 8,303,878 B2
(45) Date of Patent: Nov. 6, 2012

(54) METHOD OF MAKING A LIGHT EMITTING DEVICE HAVING A MOLDED ENCAPSULANT

(75) Inventors: D. Scott Thompson, Woodbury, MN (US); Larry D. Boardman, Woodbury, MN (US); Catherine A. Leatherdale, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/307,380

(22) Filed: Nov. 30, 2011

(65) Prior Publication Data

US 2012/0070921 A1 Mar. 22, 2012

Related U.S. Application Data

(62) Division of application No. 11/834,137, filed on Aug. 6, 2007, now Pat. No. 8,092,735.

(60) Provisional application No. 60/822,714, filed on Aug. 17, 2006.

(51) Int. Cl.
*H01L 21/56* (2006.01)

(52) U.S. Cl. ......... 264/272.17; 264/272.11; 264/272.13; 264/272.14; 264/494

(58) Field of Classification Search .................. None
See application file for complete search history.

(56) References Cited

U.S. PATENT DOCUMENTS

| | | | |
|---|---|---|---|
| 2,823,218 A | 2/1958 | Speier |
| 3,159,662 A | 12/1964 | Ashby |
| 3,220,972 A | 11/1965 | Lamoreaux |
| 3,410,886 A | 11/1968 | Joy |
| 3,419,593 A | 12/1968 | Willing |
| 3,445,420 A | 5/1969 | Kookootsedes |
| 3,715,334 A | 2/1973 | Karstedt |
| 3,814,730 A | 6/1974 | Karstedt |
| 3,933,880 A | 1/1976 | Bergstrom |
| 3,989,666 A | 11/1976 | Niemi |
| 3,989,667 A | 11/1976 | Lee |
| 4,256,870 A | 3/1981 | Eckberg |
| 4,347,346 A | 8/1982 | Eckberg |
| 4,421,903 A | 12/1983 | Ashby |
| 4,435,259 A | 3/1984 | Chang |
| 4,504,645 A | 3/1985 | Melancon |
| 4,510,094 A | 4/1985 | Drahnak |
| 4,530,879 A | 7/1985 | Drahnak |
| 4,585,669 A | 4/1986 | Eckberg |
| 4,587,137 A | 5/1986 | Eckberg |
| 4,600,484 A | 7/1986 | Drahnak |
| 4,609,574 A | 9/1986 | Keryk |
| 4,613,215 A | 9/1986 | Chandra |

(Continued)

FOREIGN PATENT DOCUMENTS

EP 0 398 573 11/1990

(Continued)

*Primary Examiner* — Joseph Del Sole
*Assistant Examiner* — Timothy Kennedy

(57) ABSTRACT

Disclosed herein is a method of making a light emitting device having an LED die and a molded encapsulant made by polymerizing at least two polymerizable compositions. The method includes: (a) providing an LED package having an LED die disposed in a reflecting cup, the reflecting cup filled with a first polymerizable composition such that the LED die is encapsulated; (b) providing a mold having a cavity filled with a second polymerizable composition; (c) contacting the first and second polymerizable compositions; (d) polymerizing the first and second polymerizable compositions to form first and second polymerized compositions, respectively, wherein the first and second polymerized compositions are bonded together; and (e) optionally separating the mold from the second polymerized composition. Light emitting devices prepared according to the method are also described.

10 Claims, 13 Drawing Sheets

U.S. PATENT DOCUMENTS

| | | |
|---|---|---|
| 4,670,531 A | 6/1987 | Eckberg |
| 4,705,765 A | 11/1987 | Lewis |
| 4,774,111 A | 9/1988 | Lo |
| 4,822,536 A | 4/1989 | Voinis |
| 4,916,169 A | 4/1990 | Boardman |
| RE33,289 E | 8/1990 | Modic |
| 5,063,102 A | 11/1991 | Lee |
| 5,122,943 A | 6/1992 | Pugh |
| 5,145,886 A | 9/1992 | Oxman |
| 5,213,864 A | 5/1993 | Wong |
| 5,310,581 A | 5/1994 | Schmidt |
| 5,313,365 A | 5/1994 | Pennisi |
| 5,403,773 A | 4/1995 | Nitta |
| 5,435,953 A | 7/1995 | Osada |
| 5,496,961 A | 3/1996 | Dauth |
| 5,507,633 A | 4/1996 | Osada |
| 5,523,436 A | 6/1996 | Dauth |
| 5,525,564 A | 6/1996 | McAfee |
| 5,603,879 A | 2/1997 | Osada |
| 5,639,845 A | 6/1997 | Inomata |
| 5,753,538 A | 5/1998 | Kuno |
| 5,777,433 A | 7/1998 | Lester |
| 5,834,035 A | 11/1998 | Osada |
| 5,895,228 A | 4/1999 | Biebuyck |
| 5,952,397 A | 9/1999 | Fujiki |
| 6,046,250 A | 4/2000 | Boardman |
| 6,099,783 A | 8/2000 | Scranton |
| 6,114,090 A | 9/2000 | Wu |
| 6,150,546 A | 11/2000 | Butts |
| 6,274,890 B1 | 8/2001 | Oshio |
| 6,274,924 B1 | 8/2001 | Carey |
| 6,319,425 B1 | 11/2001 | Tasaki |
| 6,367,949 B1 | 4/2002 | Pederson |
| 6,376,569 B1 | 4/2002 | Oxman |
| 6,451,869 B1 | 9/2002 | Butts |
| 6,473,554 B1 | 10/2002 | Pelka |
| 6,576,488 B2 | 6/2003 | Collins, III |
| 6,598,998 B2 | 7/2003 | West |
| 6,600,175 B1 | 7/2003 | Baretz |
| 6,617,401 B2 | 9/2003 | Rubinsztajn |
| 6,653,157 B2 | 11/2003 | Kondo |
| 6,664,318 B1 | 12/2003 | Bymark |
| 6,679,621 B2 | 1/2004 | West |
| 6,682,331 B1 | 1/2004 | Peh |
| 6,717,362 B1 | 4/2004 | Lee |
| 6,740,465 B2 | 5/2004 | Liang |
| 6,756,731 B1 | 6/2004 | Sano |
| 6,806,509 B2 | 10/2004 | Yoshino |
| 6,806,658 B2 | 10/2004 | Tan |
| 6,921,929 B2 | 7/2005 | LeBoeuf |
| 6,958,250 B2 | 10/2005 | Yang |
| 6,977,188 B2 | 12/2005 | Takase |
| 7,192,795 B2 | 3/2007 | Boardman |
| 7,655,486 B2 | 2/2010 | Thompson |
| 2001/0026011 A1 | 10/2001 | Roberts |
| 2002/0030194 A1 | 3/2002 | Camras |
| 2002/0141006 A1 | 10/2002 | Pocius |
| 2003/0107316 A1 | 6/2003 | Murakami |
| 2003/0115907 A1 | 6/2003 | Patton |
| 2004/0036081 A1 | 2/2004 | Okazaki |
| 2004/0053059 A1 | 3/2004 | Mistele |
| 2004/0084681 A1 | 5/2004 | Roberts |
| 2004/0116640 A1 | 6/2004 | Miyoshi |
| 2004/0145913 A1 | 7/2004 | Ouderkirk et al. |
| 2004/0150991 A1 | 8/2004 | Ouderkirk |
| 2004/0227149 A1 | 11/2004 | Ibbetson |
| 2004/0245541 A1 | 12/2004 | Shitagaki |
| 2005/0162733 A1 | 7/2005 | Cho |
| 2005/0244649 A1 | 11/2005 | Kashiwagi |
| 2006/0035092 A1 | 2/2006 | Shimizu |
| 2006/0091418 A1 | 5/2006 | Chew |
| 2006/0091798 A1 | 5/2006 | Ouderkirk |
| 2006/0105478 A1 | 5/2006 | Camras |
| 2006/0105481 A1 | 5/2006 | Boardman |
| 2006/0105484 A1 | 5/2006 | Basin |
| 2006/0105485 A1 | 5/2006 | Basin |
| 2006/0157875 A1 | 7/2006 | Van Santen |
| 2006/0186428 A1 | 8/2006 | Tan |
| 2006/0226774 A1 | 10/2006 | Sofue |
| 2007/0092636 A1 | 4/2007 | Thompson |
| 2007/0092736 A1 | 4/2007 | Boardman |
| 2007/0092737 A1 | 4/2007 | Boardman |
| 2007/0112147 A1 | 5/2007 | Mouta |
| 2007/0134425 A1 | 6/2007 | Morita |
| 2007/0141739 A1 | 6/2007 | Thompson |
| 2007/0269586 A1 | 11/2007 | Leatherdale |
| 2008/0044934 A1 | 2/2008 | Loh |

FOREIGN PATENT DOCUMENTS

| | | |
|---|---|---|
| EP | 1 198 016 | 4/2002 |
| JP | 05-019705 | 1/1993 |
| JP | 10-261821 | 9/1998 |
| JP | 2002-232018 | 8/2002 |
| KR | 2004-0086871 | 8/2002 |
| WO | 95/25735 | 9/1995 |
| WO | 2006/013066 | 2/2006 |
| WO | 2007/024069 | 3/2007 |

United States Patent US 8,303,878 B2

METHOD OF MAKING A LIGHT EMITTING DEVICE HAVING A MOLDED ENCAPSULANT

CROSS REFERENCE TO RELATED APPLICATION

This application is a divisional of U.S. application Ser. No. 11/834,137, filed Aug. 6, 2007, now U.S. Pat. No. 8,092,735 now allowed, which claims the benefit of U.S. Provisional Patent Application No. 60/822,714, filed Aug. 17, 2006, the disclosure of which is incorporated herein by reference in its entirety.

FIELD OF THE INVENTION

The invention relates to a method of making a light emitting device having an light emitting diode (LED) die and a molded encapsulant, wherein the molded encapsulant is made by polymerizing at least two polymerizable compositions.

BACKGROUND

Encapsulation of semiconductor devices has traditionally been accomplished using a transfer molding process in which a thermoset molding compound (typically a solid epoxy preform) is dielectrically preheated and then placed into a pot of a molding tool. A transfer cylinder, or plunger, is used to push the molding compound into a runner system and gates of the mold. The molding compound then flows over the chips, wirebonds, and leadframes, encapsulating the semiconductor device. Most transfer molding processes suffer from significant problems arising from high operating temperatures (the molding compound is a solid at room temperature) and high pressures required to fill the mold (even in the melt state, the molding compound has a high viscosity, and the viscosity increases further with reaction). These problems can lead to incomplete mold filling, thermal stresses (since the reaction temperature is much higher than the final use temperature), and wire sweep. In general, there is a need for new methods of making LED devices having molded encapsulants.

SUMMARY

Disclosed herein is a method of making a light emitting device having an LED die and a molded encapsulant, wherein the molded encapsulant is made by polymerizing at least two polymerizable compositions.

In one aspect, the method for making the light emitting device comprises: (a) providing an LED package comprising an LED die disposed in a reflecting cup, the reflecting cup filled with a first polymerizable composition such that the LED die is encapsulated; (b) providing a mold having a cavity filled with a second polymerizable composition; (c) contacting the first and second polymerizable compositions; (d) polymerizing the first and second polymerizable compositions to form first and second polymerized compositions, respectively, wherein the first and second polymerized compositions are bonded together; and (e) optionally separating the mold from the second polymerized composition.

In another aspect, the method for making the light emitting device comprises: (a) providing an LED package comprising an LED die disposed in a reflecting cup, the reflecting cup filled with a first polymerizable composition such that the LED die is encapsulated; (b) providing a transparent mold having a cavity filled with a second polymerizable composition; (c) polymerizing the first polymerizable composition to form a first partially polymerized composition, wherein polymerizing the first polymerizable composition comprises applying actinic radiation having a wavelength of 700 nm or less; (d) inverting the LED package to contact the first partially polymerized composition and the second polymerizable composition; and (e) polymerizing the second polymerizable composition to form a second partially polymerized composition, wherein polymerizing the second polymerizable composition comprises applying actinic radiation having a wavelength of 700 nm or less.

In another aspect, the method for making the light emitting device comprises: (a) providing an LED package comprising an LED die disposed in a reflecting cup, the reflecting cup filled with a first polymerizable composition such that the LED die is encapsulated; (b) providing a transparent mold having a cavity filled with a second polymerizable composition; (c) polymerizing the second polymerizable composition to form a second partially polymerized composition, wherein polymerizing the second polymerizable composition comprises applying actinic radiation having a wavelength of 700 nm or less; (d) inverting the mold to contact the first polymerizable composition and the second partially polymerized composition; and (e) polymerizing the first polymerizable composition to form a first partially polymerized composition, wherein polymerizing the first polymerizable composition comprises applying actinic radiation having a wavelength of 700 nm or less.

In another aspect, the method for making the light emitting device comprises: (a) providing an LED package comprising an LED die disposed in a reflecting cup, the reflecting cup filled with a first polymerizable composition such that the LED die is encapsulated; (b) providing a mold having a cavity filled with a second polymerizable composition; (c) polymerizing the first and second polymerizable compositions to form first and second partially polymerized compositions, respectively, wherein polymerizing comprises applying actinic radiation having a wavelength of 700 nm or less; and (d) contacting the first and second partially polymerized compositions.

In another aspect, the method for making the light emitting device comprises: (a) providing an LED package comprising an LED die disposed in a reflecting cup, the reflecting cup filled with a first polymerizable composition such that the LED die is encapsulated; (b) providing a mold having a cavity filled with a second polymerizable composition; (c) polymerizing the first polymerizable composition to form a first partially polymerized composition, wherein polymerizing the first polymerizable composition comprises heating; (d) inverting the LED package to contact the first partially polymerized composition and the second polymerizable composition; and (e) polymerizing the second polymerizable composition to form a second partially polymerized composition, wherein polymerizing the second polymerizable composition comprises heating.

In another aspect, the method for making the light emitting device comprises: (a) providing an LED package comprising an LED die disposed in a reflecting cup, the reflecting cup filled with a first polymerizable composition such that the LED die is encapsulated; (b) providing a mold having a cavity filled with a second polymerizable composition; (c) polymerizing the second polymerizable composition to form a second partially polymerized composition, wherein polymerizing the second polymerizable composition comprises heating; (d) inverting the mold to contact the first polymerizable composition and the second partially polymerized composition; and (e) polymerizing the first polymerizable composition to form a first partially polymerized composition, wherein polymerizing the first polymerizable composition comprises heating.

In another aspect, the method for making the light emitting device comprises: (a) providing an LED package comprising an LED die disposed in a reflecting cup, the reflecting cup filled with a first polymerizable composition such that the LED die is encapsulated; (b) providing a mold having a cavity filled with a second polymerizable composition; (c) polymerizing the first and second polymerizable compositions to form first and second partially polymerized compositions, respectively, wherein polymerizing comprises heating; and (d) contacting the first and second partially polymerized compositions.

In another aspect, the method for making the light emitting device comprises: (a) providing an LED package comprising an LED die disposed in a reflecting cup, the reflecting cup filled with a first polymerizable composition such that the LED die is encapsulated, wherein the first polymerizable composition is thixotropic; (b) providing a mold having a cavity filled with a second polymerizable composition, wherein the second polymerizable composition is thixotropic; (c) contacting the first and second polymerizable compositions; and (d) polymerizing the first and second polymerizable compositions to form first and second polymerized compositions, respectively, wherein the first and second polymerized compositions are bonded together, and polymerizing comprises applying actinic radiation having a wavelength of 700 nm or less and/or heating.

Also disclosed herein is an LED device prepared according to any one of the methods disclosed herein.

These and other aspects of the invention will be apparent from the detailed description and drawings below. In no event should the above summary be construed as a limitation on the claimed subject matter, which subject matter is defined solely by the claims as set forth herein and as may be amended during prosecution.

The invention may be more completely understood in consideration of the following detailed description in connection with the Figures described above. The Figures are illustrative examples only.

DETAILED DESCRIPTION

This application is related to the following which are incorporated herein by reference: U.S. Pat. No. 7,192,795 B2 (Boardman et al.); and U.S. Ser. Nos. 11/252,336 (Boardman et al.); 11/255,711 (Boardman et al.); 11/255,712 (Boardman et al.); 11/551,309 (Thompson et al.); 11/551,323 (Thompson et al.); and 11/741,808 (Thompson et al.).

Figure 1:
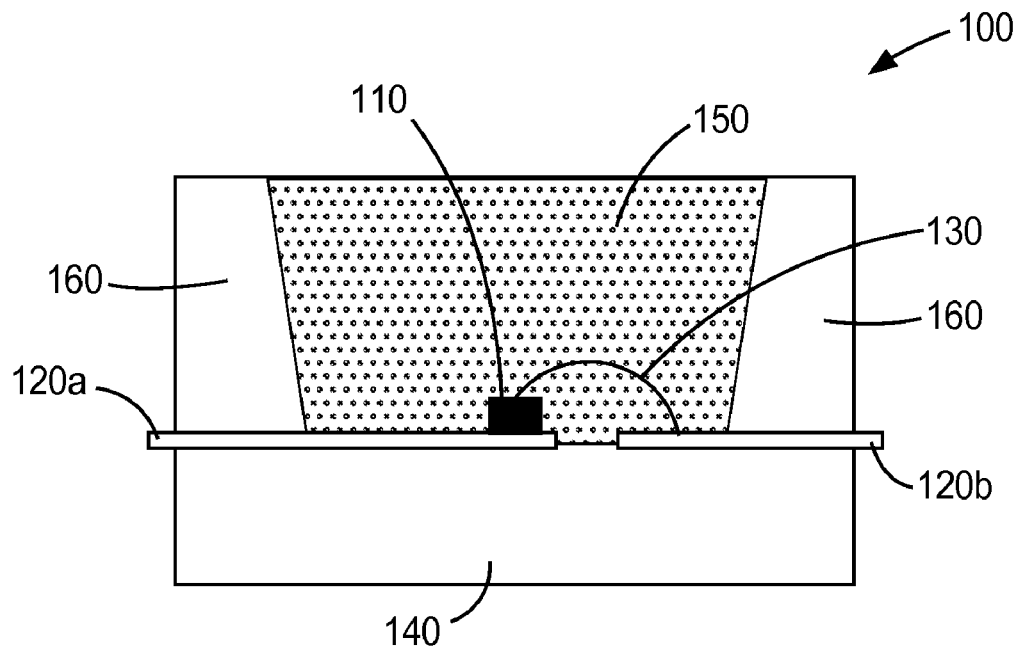
FIGS. 1 and 2 are schematic diagrams of known LED devices.

LED devices can be manufactured in a variety of configurations, many of which incorporate one or two conductive metal wires connecting the semiconductor die to electrodes in the base of the LED package. FIG. 1 is a schematic diagram of known LED device 100 with one wire bond 130 bonded to LED die 110. The LED die is connected to electrodes 120a and 120b, which are disposed on substrate 140 inside reflecting cup 160. The LED die is encapsulated with encapsulant 150 which serves to both increase the amount of light extracted from the die as well as to protect components from physical damage.

Figure 2:
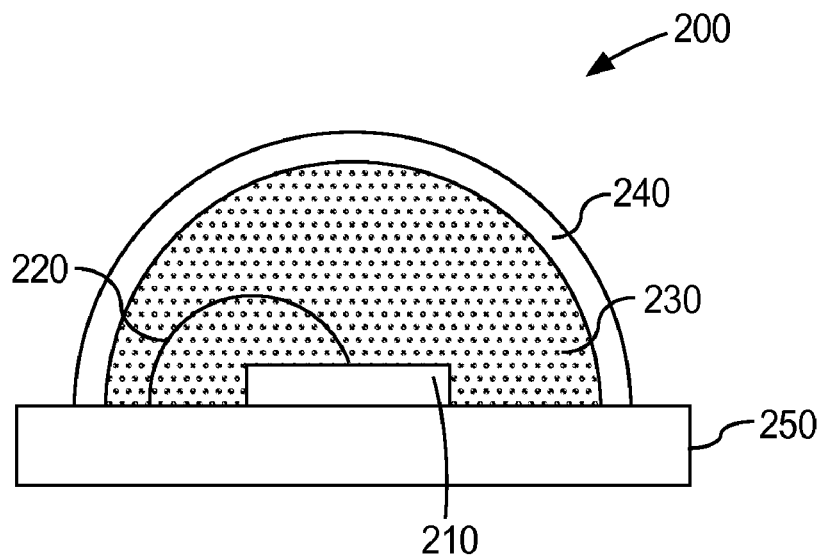

FIG. 2 is a schematic diagram of known LED device 200 with one wire bond 220 bonded to LED die 210. The LED die is mounted on substrate 250 and is encapsulated by dome-shaped encapsulant 230 and outer shell 240. The outer shell is a separately molded lens used to mold the encapsulant. The convex shape of the encapsulant and outer shell, optically coupled to the LED die, can be used to control the distribution of light emitted by the die and can also improve efficiency and light output. Performance of an LED device is improved because the amount of light being recycled is minimized. This is beneficial because light from the LED die can impinge on the lens/air interface at an angle closer to the surface normal for the majority of angles of light emitted from the LED die. This helps to minimize Fresnel reflection at the lens/air interface and results in a more efficient LED device with increased total radiant flux or light output.

LED devices having a separately molded lens, such as LED device 200, are expensive and complex to manufacture. For one, the lens must be made separately, for example, by injection molding, and in additional steps, the lens must be attached to the package in a pick and place operation and the cavity formed by the lens and the package must then be filled with encapsulant resin. Most injection moldable plastics that are suitable for making hard lenses have refractive indices significantly higher than the most photostable silicone materials used for encapsulating an LED die. This can lead to non-optimal LED performance.

The method disclosed herein provides several advantages. The method can be used to manufacture an LED device using at least two polymerizable compositions, one to encapsulate an LED die, and one to provide a lens with an output surface that is optically coupled to the die such that lifetime, efficiency, and light output of the device are improved. With an appropriate combination of polymerizable compositions and cure conditions, both encapsulation and formation of the lens with an output surface can be carried out in relatively few steps such that formation of the LED device is fast and economical.

Another advantage is that the polymerizable compositions may be different from each other as described in 11/741,808 (Thompson et al.). For example, a polymerizable composition that forms a soft encapsulant, and which provides lower stress in the LED package, can be used around the LED die and wire bond(s), and a different polymerizable composition that forms a hard molded element can be used to provide the output surface. For another example, the refractive index of the molded element can be selected to be less than that of the encapsulant.

Another advantage is that actinic radiation can be used such that harmful temperatures can be avoided. Yet another advantage is that the method is amenable to large scale manufacturing processes such that a plurality of LED devices can be manufactured simultaneously or nearly simultaneously.

The method disclosed herein comprises providing an LED package comprising an LED die disposed on a substrate in a reflecting cup.

The reflecting cup is filled with a first polymerizable composition such that the LED die is encapsulated. Suitable materials for the first polymerizable composition include those that are thermally stable, photochemically stable, clear and colorless in nature. Herein, thermally stable refers to a material that does not chemically degrade upon prolonged exposure to heat, particularly with respect to the formation of colored or light absorbing degradation products. Herein, photochemically stable refers to a material that does not chemically degrade upon prolonged exposure to actinic radiation, particularly with respect to the formation of colored or light absorbing degradation products.

The first polymerizable composition may comprise a silicone gel, silicone gum, silicone fluid, organosiloxane, polysiloxane, colorless polyimide, polyphosphazene, sol-gel, epoxy, (meth)acrylate, epoxy-functional silicone, or (meth)acrylated silicone. For example, the first polymerizable composition may comprise a silicon-containing resin comprising silicon-bonded hydrogen and aliphatic unsaturation. For another example, the first polymerizable composition may comprise an organosiloxane liquid or gel material. Preferred liquid or gel materials are curing curing silicone fluids that build viscosity on irradiation, silicone gums made from low molecular weight fluids that cure and chain extend into gum like materials (i.e. no crosslinking) on irradiation with UV light, curing silicone gels, and curing silicone fluids that polymerize to form elastomeric or nonelastomeric materials.

In one embodiment, the first polymerizable composition can be photopolymerizable, i.e., can be polymerized by applying actinic radiation having a wavelength of 700 nm or less, preferably from 250 to 500 nm. If desired, in order to accelerate polymerization, the first polymerizable composition can be polymerized by simultaneously applying actinic radiation having a wavelength of 700 nm or less and heating at a temperature of less than 150° C., less than 120° C., less than 60° C., or at 25° C. or less. Examples of sources of actinic radiation include tungsten halogen lamps, xenon arc lamps, mercury arc lamps, incandescent lamps, germicidal lamps, fluorescent lamps, LEDs, or lasers.

In one embodiment, the first polymerizable composition comprises a photopolymerizable composition of a silicon-containing resin having groups incorporating aliphatic unsaturation and silicon-bonded hydrogen. The groups undergo a hydrosilylation reaction which is initiated in the presence of a metal-containing catalyst and actinic radiation having a wavelength of 700 nm or less. Such compositions are described in U.S. Pat. No. 7,192,795 B2 (Boardman et al.) and references cited therein. They can be useful when rapid cure times of seconds to less than 30 minutes are desirable. The silicon-containing resin can include monomers, oligomers, polymers, or mixtures thereof. The silicon-bonded hydrogen and the aliphatic unsaturation may or may not be present in the same molecule. Furthermore, the aliphatic unsaturation may or may not be directly bonded to silicon.

The silicon-containing resin can comprise an organosiloxane (i.e., a silicone) which includes an organopolysiloxane. The silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Curable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_aR^2_bSiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule. Organopolysiloxanes that contain aliphatic unsaturation preferably have an average viscosity of at least 5 mPa·s at 25° C.

Organopolysiloxanes that contain silicon-bonded hydrogen are preferably linear, cyclic or branched organopolysiloxanes comprising units of the formula $R^1_aH_cSiO_{(4-a-c)/2}$ wherein: $R^1$ is as defined above; a is 0, 1, 2, or 3; c is 0, 1, or 2; and the sum of a+c is 0, 1, 2, or 3; with the proviso that there is on average at least 1 silicon-bonded hydrogen atom present per molecule. In one embodiment, at least 90 mole percent of the $R^1$ groups are methyl. In another embodiment, the $R^1$ groups are methyl, phenyl, or a combination thereof. Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1_aR^2_bSiO_{(4-a-b)/2}$ and $R^1_aH_cSiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

Organopolysiloxane resins having a significant fraction of the $R^1$ groups as phenyl or other aryl, aralkyl, or alkaryl are preferred, because the incorporation of these groups provides materials having higher refractive indices than materials wherein all of the $R^1$ radicals are, for example, methyl. As described herein, particles may be used in the first polymerizable composition in order to increase refractive index.

The compositions described in U.S. Pat. No. 7,192,795 B2 (Boardman et al.) also include a metal-containing catalyst that enables cure of the material via radiation-activated hydrosilylation. These catalysts typically include complexes of precious metals such as platinum, rhodium, iridium, cobalt, nickel, and palladium. The precious metal-containing catalyst preferably contains platinum. Certain preferred platinum-containing catalysts are selected from the group consisting of Pt(II) β-diketonate complexes, ($\eta^5$-cyclopentadienyl)tri(σ-aliphatic)platinum complexes, and $C_{7-20}$-aromatic substituted ($\eta^5$-cyclopentadienyl)tri(σ-aliphatic)platinum complexes. Such catalysts are used in an amount effective to accelerate the hydrosilylation reaction and preferably in an amount of no greater than 1000 parts of metal per one million parts of the composition.

In another embodiment, the first polymerizable composition comprises a nonphotopolymerizable composition of a silicon-containing resin having groups incorporating aliphatic unsaturation and silicon-bonded hydrogen. For example, polymerization of the silicon-containing resin may be carried out by applying heat to the nonphotopolymerizable composition comprising the silicon-containing resin and a suitable catalyst. Catalysts include complexes of precious metals such as platinum, rhodium, iridium, cobalt, nickel, and palladium and, for example, in U.S. Pat. Nos. 2,823,218 (Speier et al), 3,419,593 (Willing), 3,715,334 and 3,814,730 (Karstedt), 4,421,903 (Ashby), 3,220,972 (Lamoreaux), 4,613,215 (Chandra et al), and 4,705,765 (Lewis). In one embodiment, the nonphotopolymerizable composition comprises a metal-containing catalyst comprising a platinum vinylsiloxane complex.

As described above, the amounts of the metal-containing catalysts used in the photopolymerizable composition may depend on a variety of factors such as whether actinic radiation and/or heat is being used, the radiation source, amount of time, temperature, etc., as well as on the particular chemistry of the silicon-containing resin, its reactivity, the amount present in the light emitting device, etc. In some embodiments, the first and second metal-containing catalysts may be independently used in an amount of at least 1 part, and more preferably at least 5 parts, per one million parts of the photopolymerizable composition. Such catalysts are preferably included in amounts of no greater than 1000 parts of metal, and more preferably no greater than 200 parts of metal, per one million parts of the photopolymerizable composition.

In one embodiment, the first polymerizable composition comprises a first partially polymerized composition. Partial polymerization may be used to increase the viscosity and/or gel the composition such that it does not flow out of the reflecting cup when the LED package is tilted or turned over. For example, the LED package may be inverted as described below. Ideally, the surface of the first partially polymerized composition has at least some tackiness or is sticky so that the adhesion between the first and second polymerized compositions is enhanced either by chemical bonding or by physical bonding, for example, by chain entanglements between the first and second polymerized compositions and/or non-bonded interactions.

In one embodiment, a nonpolymerizable composition may be used instead of the first polymerizable composition. That is, the method may comprise: (a) providing an LED package comprising an LED die disposed in a reflecting cup, the reflecting cup filled with a nonpolymerizable composition such that the LED die is encapsulated; (b) providing a mold having a cavity filled with a second polymerizable composition; (c) contacting the nonpolymerizable composition and the second polymerizable composition; (d) polymerizing the second polymerizable composition to form a second polymerized composition, wherein the nonpolymerizable and second polymerizable compositions are bonded together; and (e) optionally separating the mold from the second polymerized composition.

The nonpolymerizable composition may comprise an organosiloxane-containing liquid, gel, elastomeric solid, or nonelastomeric solid. The nonpolymerizable composition may also comprise polyimide, polyphosphazene, epoxy, (meth)acrylate, and sol-gel material. For example, the nonpolymerizable composition may comprise a silicone gel, silicone gum, silicone fluid, organosiloxane, polysiloxane, colorless polyimide, polyphosphazene, sol-gel, epoxy-functional silicone, or (meth)acrylated silicone.

The method disclosed herein comprises providing a mold having a cavity. The cavity is shaped to impart a desired complimentary shape to the outer surface of the second polymerizable composition. Any material capable of being formed into a mold may be used, and in general, it is usually desirable for the mold material to have a glass transition temperature greater than the particular temperature(s) used in a method of making the light emitting device as described below. Useful mold materials are described in U.S. Ser. Nos. 11/551,309 (Thompson et al.) and 11/551,323 (Thompson et al.) and include polymeric materials such as fluoroelastomers, polyolefins, polystyrene, polyesters, polyurethanes, polyethers, polycarbonates, polymethyl methacrylate; inorganic materials comprising ceramics, quartz, sapphire, metals, and certain glasses; and organic-inorganic hybrid materials.

The mold may be transparent, particularly when the method comprises photopolymerization after any of the first and second compositions are contacted with each other. The first and second compositions may also be partially polymerized compositions or some combination thereof. It is generally desirable for the mold to be transparent at the wavelength of the actinic radiation. In this regard, transparent refers to transmission greater than 50%, greater than 60%, or greater than 70% at the wavelength of the actinic radiation. Examples of transparent mold materials include transparent plastics and ceramics as described above. The mold can also be non-transparent such as an opaque ceramic, an opaque plastic, or a metal. The mold can be fabricated by conventional machining, diamond turning, contact lithography, projection lithography, interference lithography, etching, or any other suitable technique. The mold may be an original master mold or a daughter mold thereof. Molding may be referred to as reactive embossing. As described below, the mold may comprise more than one cavity. For example, the mold may comprise a thin sheet of plastic material with formed cavities, such as can be produced in a vacuum molding process or can be thicker blocks of material with formed or machined cavities. The surface of the mold that contacts the second polymerizable composition may be coated with a release material in order to facilitate removal of the mold from the composition. Examples of release materials include household detergents in water and fluorocarbon release agents.

The mold may be shaped so as to impart any useful structure on the surface of the second polymerizable composition. Suitable structured surfaces are described in U.S. Ser. Nos. 11/551,309 (Thompson et al.) and 11/551,323 (Thompson et al.). For example, the mold may be shaped so as to form a refractive lens on the LED. Lensing refers to the uniform (or nearly uniform) curvature of a substantial portion of the surface of the encapsulant to form a positive or negative lens, the diameter of which is approximately the size of the package or reflector cup. In general, a lensed surface can be characterized by a "radius of curvature." The radius of curvature can be either positive, denoting a convex surface or negative denoting a concave surface or infinite denoting a flat surface. Lensing can improve light extraction by reducing the total internal reflections of light incident at the encapsulant-air interface. It can also change the angular distribution of light emitted from the light emitting device. In one embodiment, the mold is shaped to impart a hemispherical lens on the second polymerizable composition.

The surface may also be shaped with macrostructures having a characteristic dimension that is smaller than the package size, but much larger than the wavelength of visible light. That is, each macrostructure may have a dimension of from 10 μm to 1 mm. The spacing or period between each macrostructure may also be from 10 μm to 1 mm (or about ⅓ the size of the LED package). Examples of macrostructures include surfaces that, when viewed in cross-section, appear to be shaped like a sine wave, triangular wave, square wave, rectified sine wave, saw tooth wave, cycloid (more generally curtate cycloid), or rippled. The periodicity of the macrostructures may be one- or two-dimensional. Surfaces with one-dimensional periodicity have repeat structures along only one major direction of the surface. In one particular example, the mold may comprise any of the Vikuiti™ Brightness Enhancement Films available from 3M Company.

The mold may be shaped to impart a lens structure capable of making a molded encapsulant that can generate a side-emission pattern. For example, the molded encapsulant has a central axis, and light entering the molded encapsulant is reflected and refracted and eventually exits in a direction substantially perpendicular to the central axis; examples of these types of side emitting lens shapes and devices are described in U.S. Pat. No. 6,679,621 B2 and U.S. Pat. No. 6,598,998 B2. For another example, the molded encapsulant has a generally planar surface, with a smoothly curved surface defining a vortex shape that extends into the encapsulant and has the shape of an equiangular spiral that forms into a cusp; an example of such a profile is described in U.S. Pat. No. 6,473,554 B1, particularly FIGS. 15, 16 and 16A.

Surfaces with two-dimensional periodicity have repeat structures along any two orthogonal directions in the plane of the macrostructures. Examples of macrostructures with two-dimensional periodicity include random surfaces, two-dimensional sinusoids, arrays of cones, arrays of prisms such as cube-corners, and lenslet arrays. The surface may also be shaped as a Fresnel lens having generally circular symmetry and that can be designed to replicate the optical properties of any positive or negative lens while occupying much less volume than a solid lens.

In general, the macrostructures do not need to be uniform in size across the surface. For example, they may get larger or smaller toward the edges of the package, or they may change shape. The surface may consist of any linear combination of shapes described herein.

The surface may also be shaped with microstructures having a characteristic dimension on a scale similar to the wavelengths of visible light. That is, each microstructure may have a dimension of from 100 nm to less than 10 µm. Light tends to diffract when it interacts with microstructured surfaces. Thus, the design of microstructured surfaces requires careful attention to the wave-like nature of light. Examples of microstructures are one- and two-dimensional diffraction gratings; one-, two-, or three-dimensional photonic crystals; binary optical elements; "motheye" anti-reflection coatings; and one- and two-dimensional arrays of prisms. The microstructures do not need to be uniform in size across the surface. For example, the elements may get larger or smaller toward the edges of the package, or they may change shape. The surface may consist of any linear combination of shapes described herein.

The surface of the encapsulant may comprise structures from all three size scales. All package surfaces will be lensed with some radius of curvature, which could be positive, negative, or infinite. A macrostructure or microstructure could be added to the lensed surface to further enhance light output or to optimize the angular distribution for a given application. A surface could even incorporate a microstructure on a macrostructure on a lensed surface.

The mold is filled with a second polymerizable composition. Suitable materials for the second polymerizable composition include those that are thermally stable, photochemically stable, clear and colorless in nature, as described above for the first polymerizable composition. For example, the second polymerizable composition may comprise an organosiloxane. For another example, the second polymerizable composition is selected from the group consisting of silicon-containing resins comprising silicon-bonded hydrogen and aliphatic unsaturation, epoxy silicones, and (meth)acrylated silicones. Silicon-containing resins comprising silicon-bonded hydrogen and aliphatic unsaturation that may be used as the second polymerizable composition comprise an organosiloxane-containing elastomer or a non-elastic solid.

In one embodiment, the second polymerizable composition can be photopolymerizable, i.e., can be polymerized by applying actinic radiation having a wavelength of 700 nm or less, preferably from 250 to 500 nm. If desired, in order to accelerate polymerization, the second polymerizable composition can be polymerized by simultaneously applying actinic radiation having a wavelength of 700 nm or less and heating at a temperature of less than 150° C., less than 120° C., less than 60° C., or at 25° C. or less. In one embodiment, the second polymerizable composition comprises a photopolymerizable composition as described previously, i.e., preferably, the second polymerizable composition comprises a silicon-containing resin having groups incorporating aliphatic unsaturation and silicon-bonded hydrogen, and a metal-containing catalyst that enables cure of the material via radiation-activated hydrosilylation.

The first and second polymerizable compositions may be the same. Alternatively, the first and second polymerizable compositions may be different from each other. For example, the first and second polymerizable compositions may be selected such that the first polymerized composition is softer than the second. By softer it is meant that the first polymerized composition is more easily deformed by an external mechanical force than the second polymerized composition. For example, the first polymerized composition may have a lower Young's modulus or lower Shore Hardness.

For the first and second photopolymerizable compositions described above, a softer first polymerized composition may be obtained by having a lower crosslink density than the second. This may be achieved by decreasing the number of silicon-bonded hydrogen atoms along the backbone of the silicon-containing resin, and/or by increasing the molecular weight of the segments between crosslinks The metal-containing catalyst used in each of the photopolymerizable compositions can also be varied so that a softer first polymerized composition may be obtained. For example, if the same metal-containing catalyst is used, then a softer first polymerized composition may be obtained by including less of the catalyst in the first photopolymerizable composition. If the same silicon-containing resin is used, then a softer first polymerized composition may be obtained by including a less reactive catalyst in the first photopolymerizable composition.

The first and second polymerized compositions may also be selected to obtain desired refractive indices. For example, the first and second polymerized compositions can have substantially the same refractive index. For another example, the first polymerized composition may have a refractive index greater than that of the second. This step down in refractive index from light emitting chip to the first polymerized composition to the second polymerized composition and finally to air, results in more efficient light extraction from the package due to minimization of light loss due Fresnel reflection and absorption. If the polymerized compositions have different refractive indices, it is possible for there to be a thin graded index layer at the interface resulting from interdiffusion of the high and low index materials. The level of interdiffusion will be a function of the chemical nature of the materials, the curing mechanism, and rate of cure.

The first and second polymerizable compositions can comprise one or more additives selected from the group consisting of nonabsorbing metal oxide particles, semiconductor particles, phosphors, sensitizers, antioxidants, pigments, photoinitiators, catalyst inhibitors, and combinations thereof. If used, such additives are used in amounts to produced the desired effect.

As described above, it may be desirable for the first encapsulant to have a refractive index greater than that of the second. This may be achieved by including high refractive index nanometer sized particles that may or may not be surface modified. If desired, the nanoparticles can be selected so that they do not introduce color or scattering to the encapsulant.

Nonabsorbing metal oxide and semiconductor particles that are substantially transparent over the emission bandwidth of the LED can be used. For example, a 1 mm thick disk of the nonabsorbing metal oxide and/or semiconductor particles mixed with encapsulant may absorb less than about 30% of the light incident on the disk. In other cases the mixture may absorb less than 10% of the light incident on the disk. Examples of nonabsorbing metal oxide and semiconductor particles include, but are not limited to, $Al_2O_3$, $ZrO_2$, $TiO_2$, $V_2O_5$, ZnO, $SnO_2$, ZnS, $SiO_2$, and mixtures thereof, as well as other sufficiently transparent non-oxide ceramic materials such as semiconductor materials including such materials as ZnS, CdS, and GaN. The particles can be surface treated to improve dispersibility in the encapsulant. Examples of such surface treatment chemistries include silanes, siloxanes, carboxylic acids, phosphonic acids, zirconates, titanates, and the like. Techniques for applying such surface treatment chemistries are known. Silica ($SiO_2$) has a relatively low refractive index but it may be useful in some applications, for example, as a thin surface treatment for particles made of higher refractive index materials, to allow for more facile surface treatment with organosilanes. In this regard, the particles can include species that have a core of one material on which is deposited a material of another type.

If used, the nonabsorbing metal oxide and semiconductor particles are preferably included in the composition in an amount of no greater than 85 wt-%, based on the total weight of the encapsulating material. Preferably, the nonabsorbing metal oxide and semiconductor particles are included in the composition in an amount of at least 10 wt-%, and more preferably in an amount of at least 45 wt-%, based on the total weight of the composition. Generally the particles can range in size from 1 nanometer to 1 micron, preferably from 10 nanometers to 300 nanometers, more preferably, from 10 nanometers to 100 nanometers. This particle size is an average particle size, wherein the particle size is the longest dimension of the particles, which is a diameter for spherical particles. It will be appreciated by those skilled in the art that the volume percent of metal oxide and/or semiconductor particles cannot exceed 74 percent by volume given a monomodal distribution of spherical particles.

In one embodiment, the second polymerized composition is harder than the first, and the first polymerized composition has a refractive index greater than that of the second.

In one embodiment, the second polymerizable composition comprises a second partially polymerized composition. Partial polymerization may be used to increase the viscosity and/or gel the composition such that it does not flow out of the mold when it is tilted or turned over. For example, the mold may be inverted as described below. Ideally, the surface of the second partially polymerized composition has at least some tackiness or is sticky so that the adhesion between the first and second polymerized compositions is enhanced either by chemical bonding or by physical bonding, for example, by chain entanglements between the first and second polymerized compositions and/or non-bonded interactions.

In one embodiment, the first and second polymerizable compositions comprise first and second partially polymerized compositions, respectively, for example, in cases where the mold has a hinge and both package and mold must be tilted.

In one embodiment, the method comprises separating the mold from the second polymerized composition to form a molded second polymerized composition. In this case, the method may further comprise heating the LED device to obtain the desired properties of the first and second compositions. Heating may be carried out at less than 150° C.

The first and second polymerizable compositions are contacted and then polymerized to form first and second polymerized compositions that are bonded together such that they cannot easily be separated, i.e., are handleable in typical manufacturing processes and in use.

Figure 3:
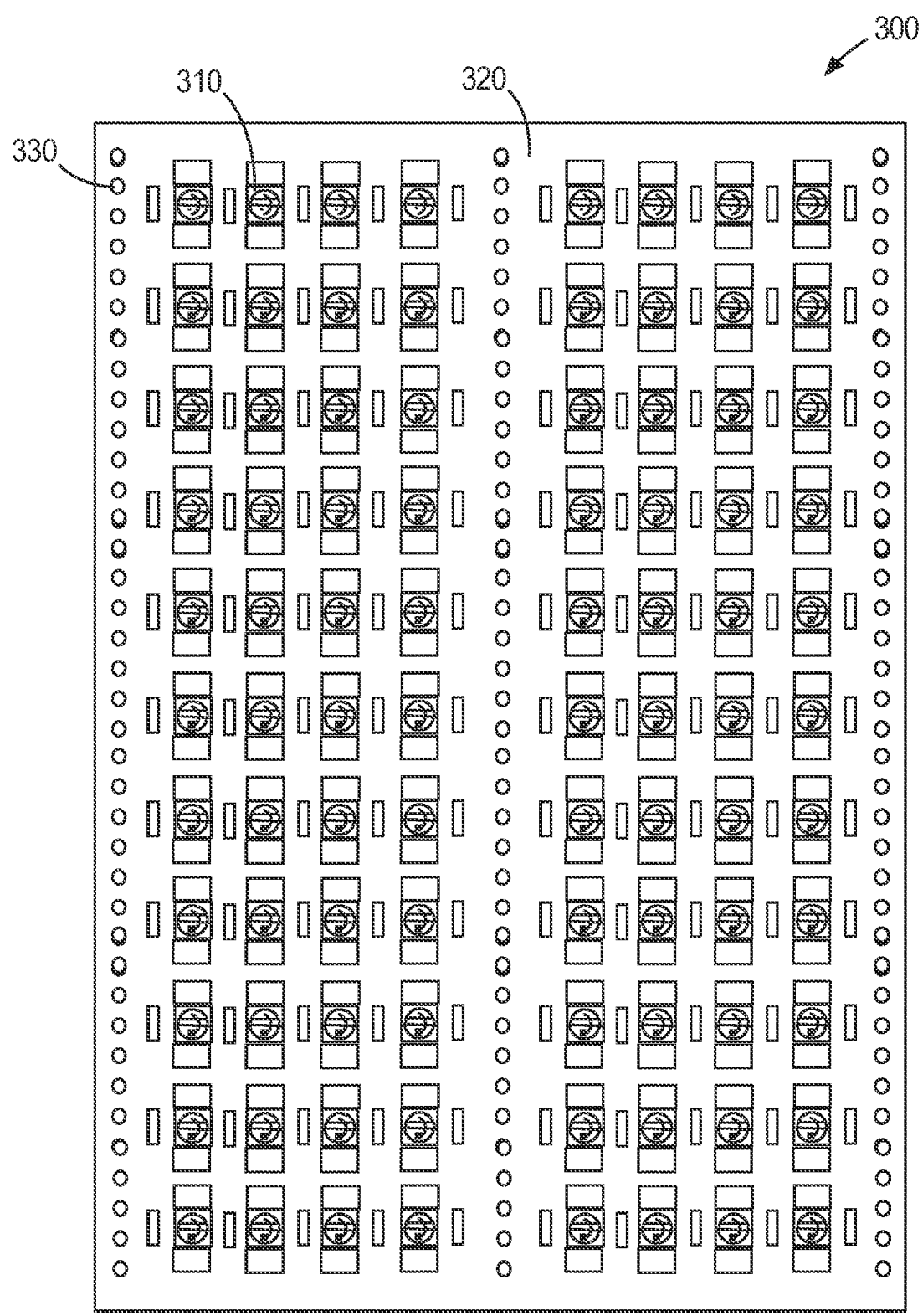
FIG. 3 shows a top down perspective of an array of LEDs on a lead frame.

For the purposes of LED device manufacture, LED packages are typically provided as an array of LED packages on lead frame. FIG. 3 shows an illustrative picture of such an array of LED packages on a lead frame 300. The LED packages 310 are typically injection molded plastic onto a punched metal lead frame 320. The small circular holes 330 running the length of the lead frame are holes for guide pins which hold the lead frame under tension on the manufacturing line and provide known registration for the array of LED packages. Other arrangements and constructions of LED packages in an array format exist as well, for example where the body of the package is made of ceramic material and the LED packages are provided as a large sheet of ceramic packages. For the purpose of the description of the disclosed processes, the array type shown in FIG. 3 will be used.

Figure 4:
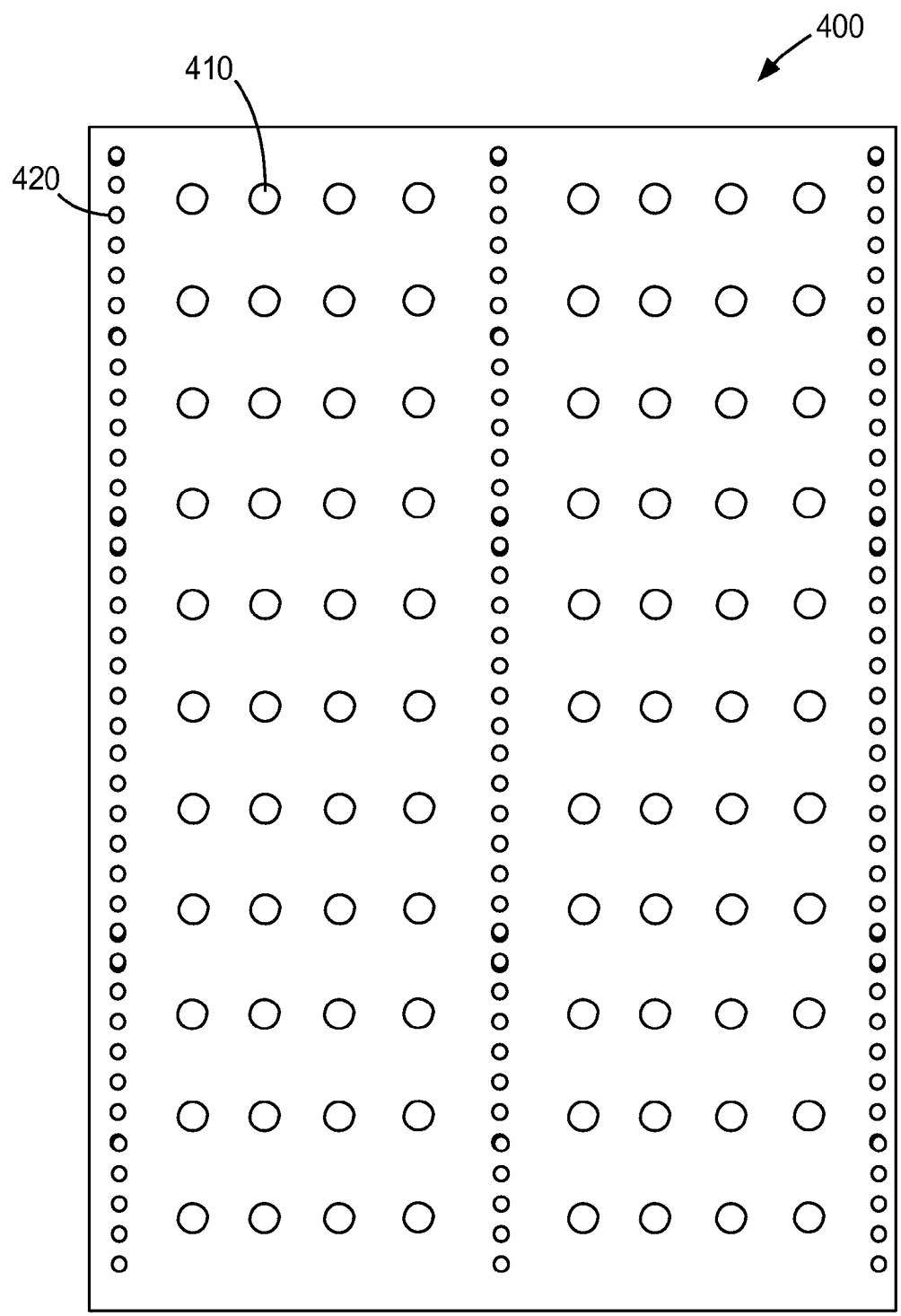
FIG. 4 shows a top down perspective of a mold.

In order to provide a process for molding lenses on an array of packages simultaneously, it is necessary to provide a mold 400 as shown in FIG. 4, which has cavities 410 shaped to produce a desired lens shape. It is important that the cavities of the mold be aligned with the LED packages on the lead frame. Placement of optional guide holes 420 in the mold surface can be used to aid in the registration of the mold cavities with the LED packages. The mold can be made from a variety of materials and may or may not be transparent to actinic radiation, particularly UV radiation, which may be used for initiating reaction in the polymerizable composition. The choice of mold material and design determines which of the following embodiments are possible.

For the embodiments shown in FIG. 5 and which are described below, the first polymerizable composition may be referred to as encapsulant resin and the second polymerizable composition may be referred to as lens resin or resin. The molded and polymerized lens resin will have an output surface.

Figure 5A:
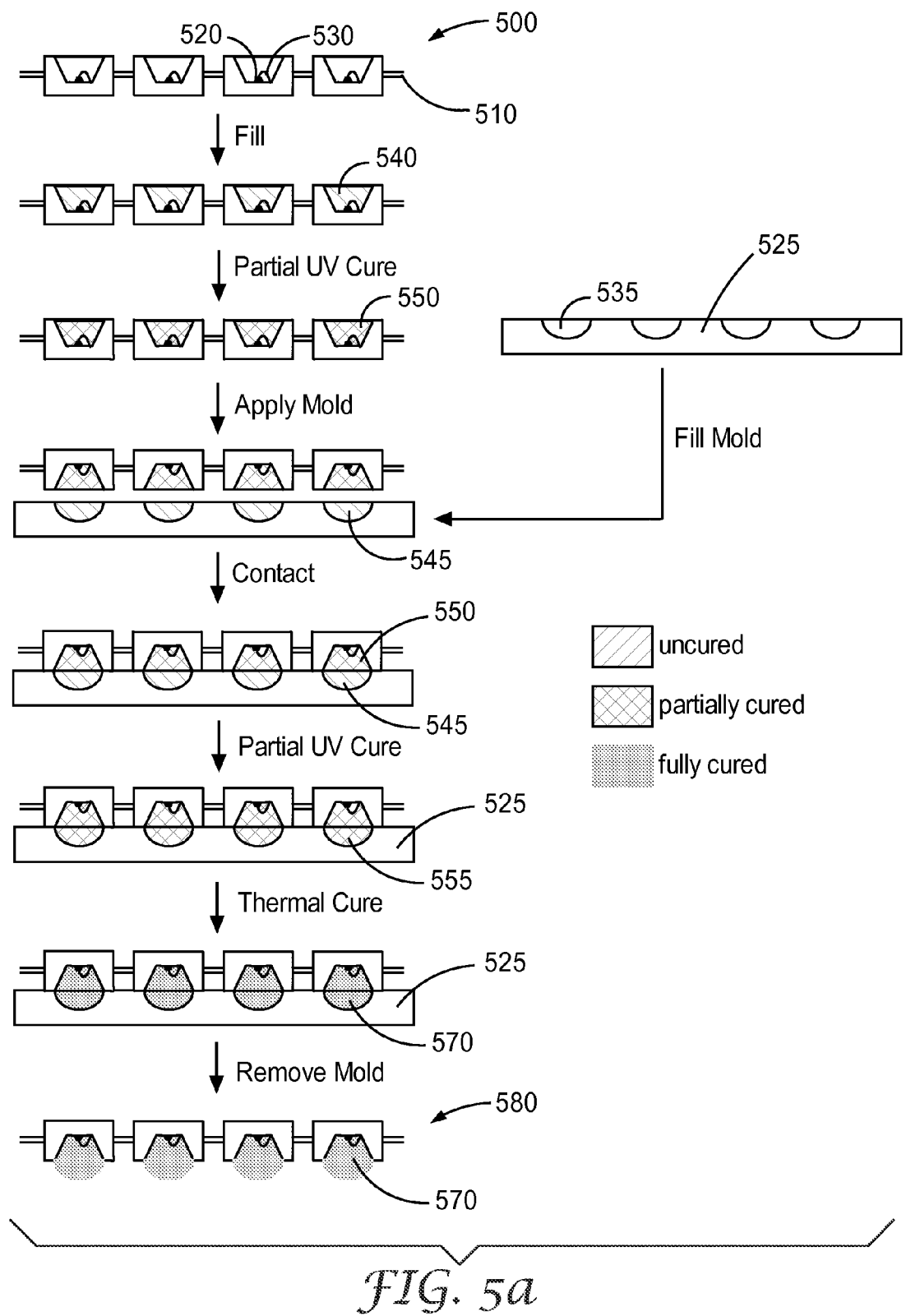
FIGS. 5a-5i are schematic diagrams of methods used to make LED devices according to embodiments of the present disclosure.
Figure 5B:
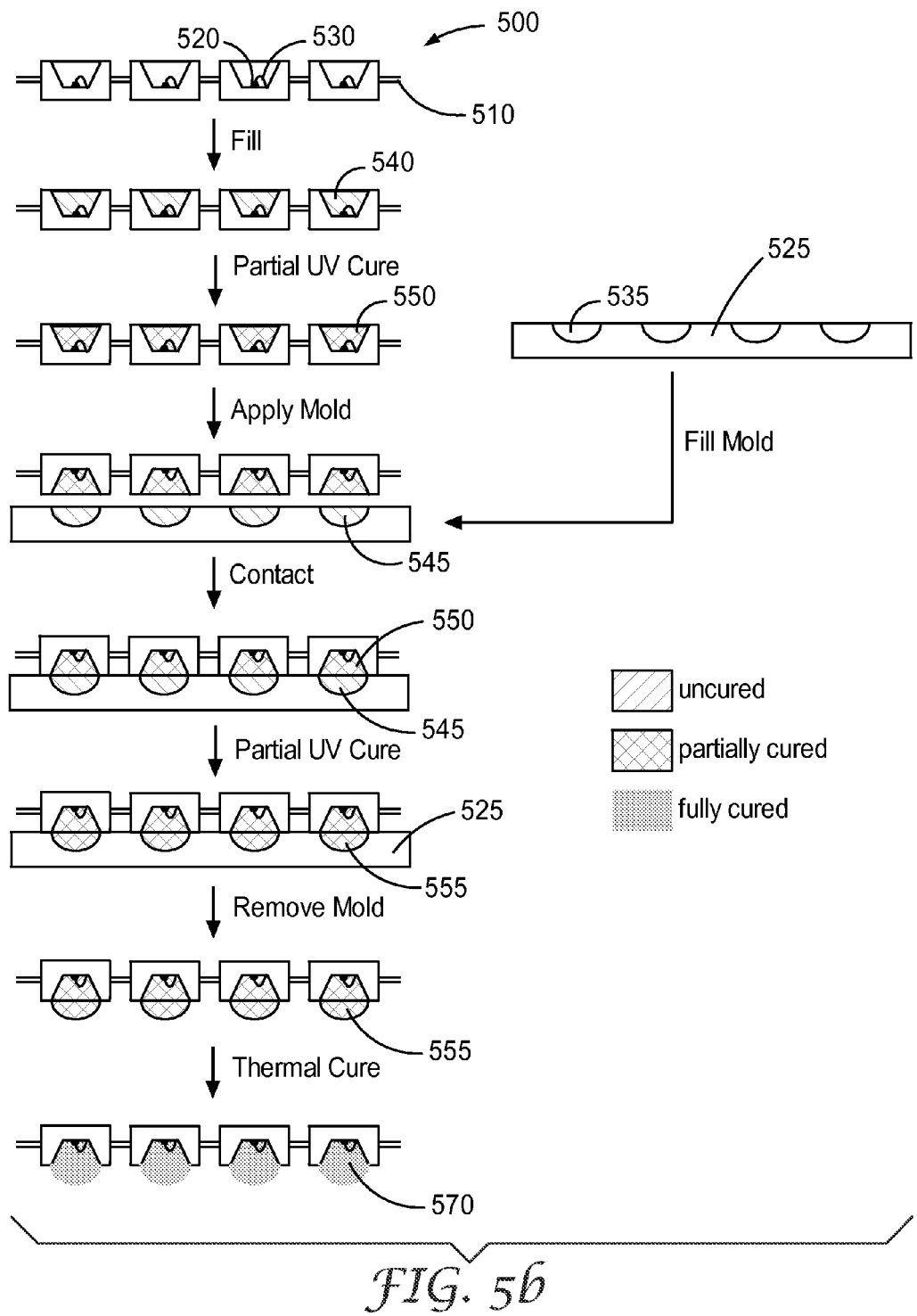

One embodiment of the molding process is shown in FIG. 5a in a cross sectional perspective and illustrates the process flow for the case where the mold material is transparent to UV radiation. Suitable mold materials will have glass transition temperatures greater than the temperatures used for the process. Such mold materials are described in U.S. Ser. Nos. 11/551,309 (Thompson et al.) and 11/551,323 (Thompson et al.) and include, but are not limited to, fluorinated molds such as those fabricated from Teflon or glass molds that have been treated with release agents. Plastic molds can be made of thin sheet like materials with formed cavities, such as can be produced in a vacuum molding process or can be thicker blocks of material with formed or machined cavities. An array of LED packages 500 on a lead frame 510 is provided with an LED die 520 and wire bonds 530 in the packages. The LED packages are filled with an uncured encapsulant resin 540. The uncured encapsulant resin is exposed to actinic radiation as described in U.S. Pat. No. 7,192,795 B2 (Boardman et al.), to at least partially cure the encapsulant resin to produce a partially cured encapsulant resin 550 that has increased in viscosity significantly or has gelled, such that the resin does not flow out of the LED package when the packages on the lead frame are tilted or turned over. The surface of the partially cured encapsulant resin has at least some tackiness or is sticky. To a mold 525 with cavities 535 designed to align with the packages on the lead frame is added uncured lens resin material 545. The array of packages with partially cured encapsulant 550 is aligned with the mold 525, which has cavities filled with uncured lens resin material 545. The packages are contacted to the mold. The assembled mold is again irradiated with actinic radiation through the mold material 525 to give partially cured lens resin 555. The assembly is then heated to finish curing the encapsulant and lens resins to give a single cured encapsulant lens material 570. In general, the resins are considered bonded together in the sense that they are not easily separated. The mold 525 can optionally be removed to give an array of LED devices with lenses 580. As shown in FIG. 5b, if partially cured resin 555 is cured to the point of being tack free on it's surface, which is in contact with the mold 525, the mold 525 can be removed prior to the heating step.

Figure 5C:
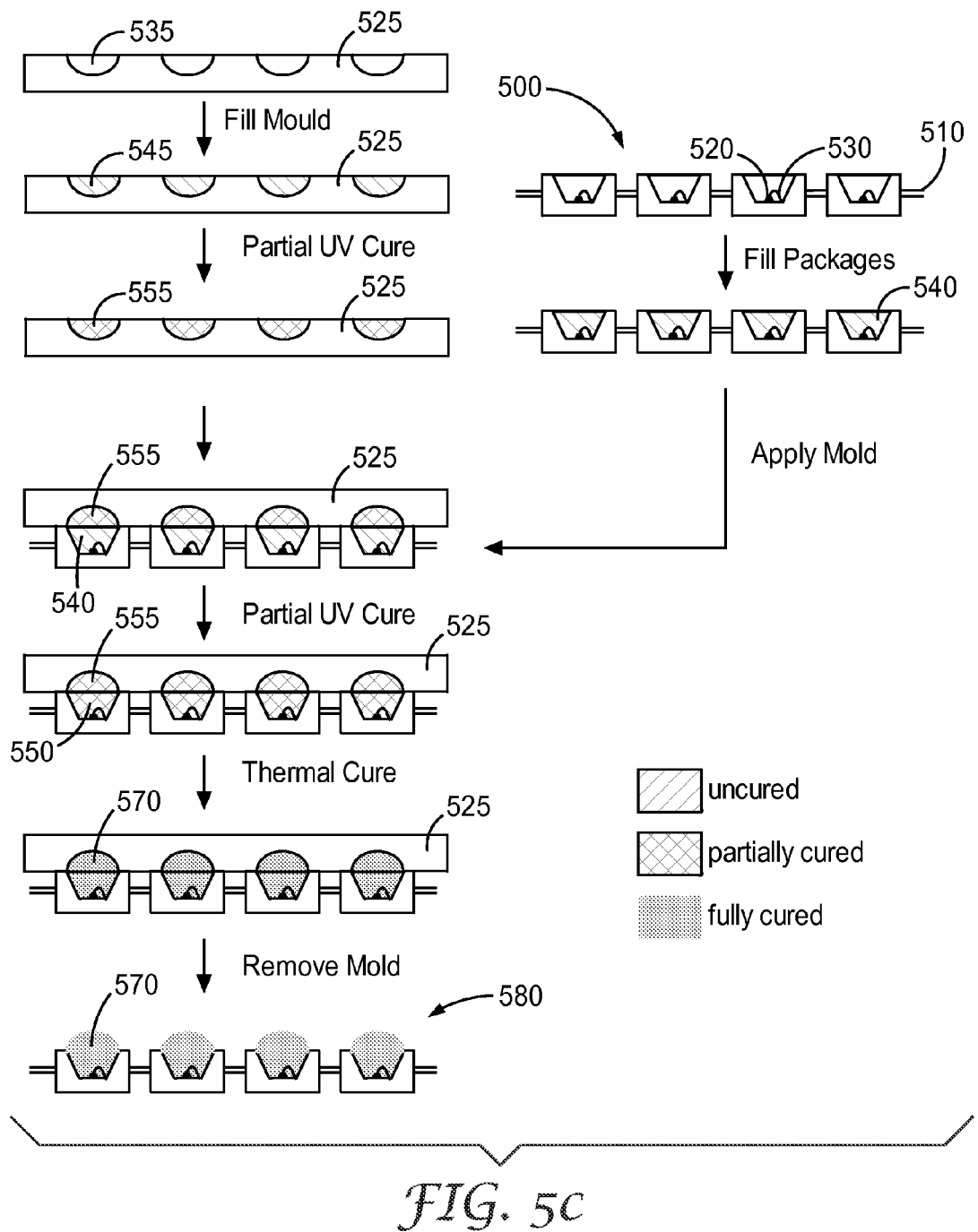

Another embodiment of the molding process is shown in FIG. 5c in a cross sectional perspective and illustrates an alternative process flow for the case where the mold material is transparent to the actinic radiation needed to cure the encapsulant and lens material. To a mold 525 with cavities designed to align with the packages on a lead frame is added uncured lens resin material 545. The uncured lens resin 545 in the mold is exposed to actinic radiation to produce a partially cured lens resin 555 that has increased in viscosity significantly or has gelled, such that the resin does not flow out of the LED package when the packages on the lead frame are tilted or turned over. To the LED packages 500 is added an uncured encapsulant resin 540. The mold with the partially cured lens resin 555 is placed in contact with the LED packages containing uncured encapsulant resin 540. The assembly is irradiated from the mold side with a sufficient amount of actinic radiation to at least partially cure the uncured encapsulant material surrounding the die and wire bond in the LED package. The assembly is then heated to finish curing the encapsulant and lens resins to give a single cured encapsulant lens material 570. The mold 525 can optionally be removed to give an array of LED devices with lenses 580.

Figure 5D:
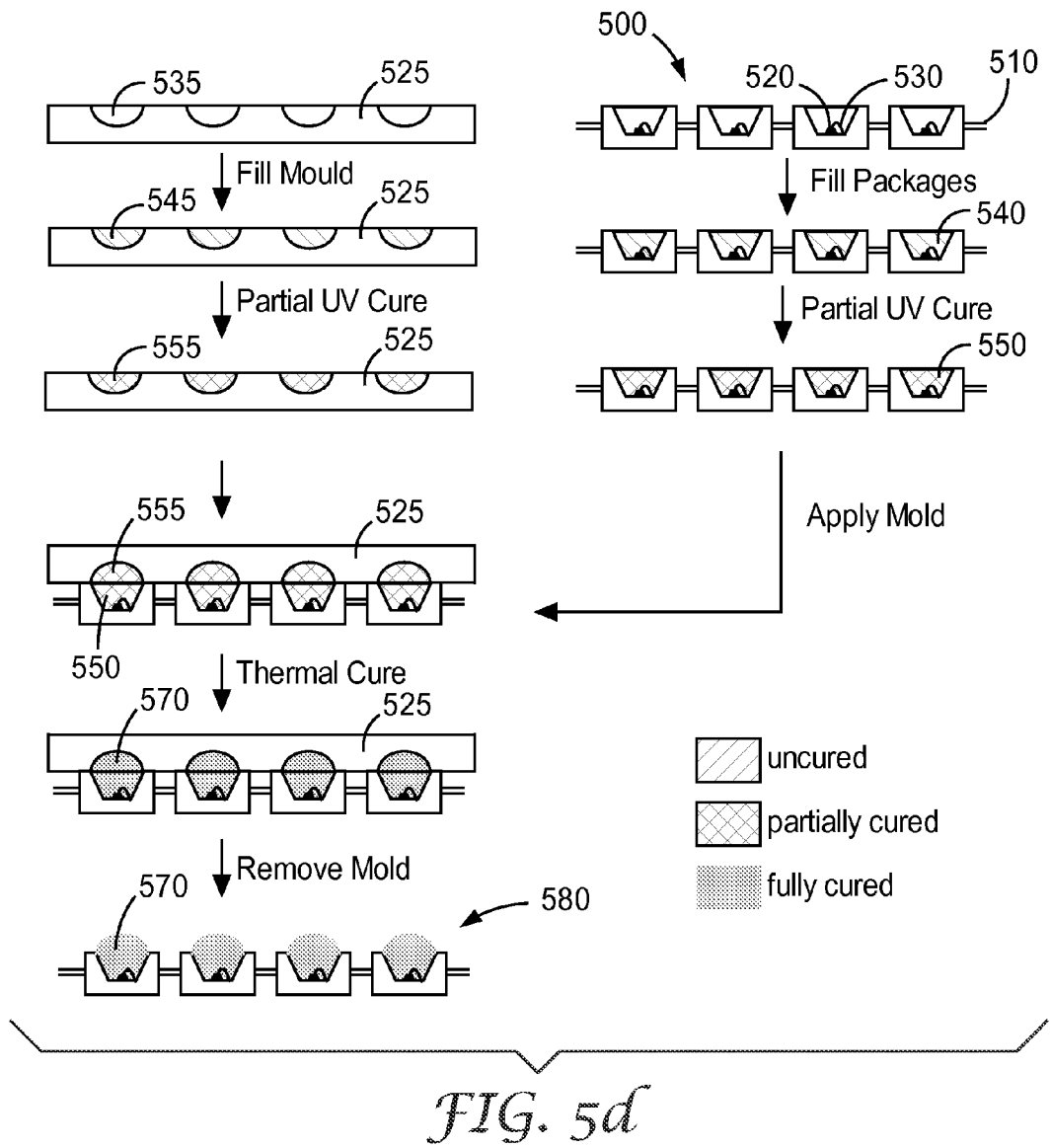

FIG. 5d illustrates an additional process flow diagram for the case where the mold material may or may not be transparent to the actinic radiation needed to cure the encapsulant and lens material. Non-transparent molds can be made from a wide variety of materials such as metals, opaque ceramics and opaque plastics. To a mold 525 with cavities 535 designed to align with the packages on the lead frame is added uncured lens resin material 545. The uncured lens resin 545 in the mold is exposed to actinic radiation to produce a partially cured lens resin 555 that has increased in viscosity significantly or has gelled, such that the resin does not flow out of the LED package when the packages on the lead frame are tilted or turned over. To the LED packages 500 is added an uncured encapsulant resin 540. The encapsulant is exposed to actinic radiation as described in U.S. Pat. No. 7,192,795 B2 (Boardman et al.) to at least partially cure the encapsulant resin to produce a partially cured resin 550 that has increased in viscosity significantly or has gelled, such that the resin does not flow out of the LED package when the packages on the lead frame are tilted or turned over. The mold with the partially cured lens resin 555 is placed in contact with the LED packages containing partially cured encapsulant resin 550. The assembly is then heated to finish curing the encapsulant and lens resins to give a single cured encapsulant lens material 570. The mold 525 can optionally be removed to give an array of LED devices with lenses 580.

Figure 5E:
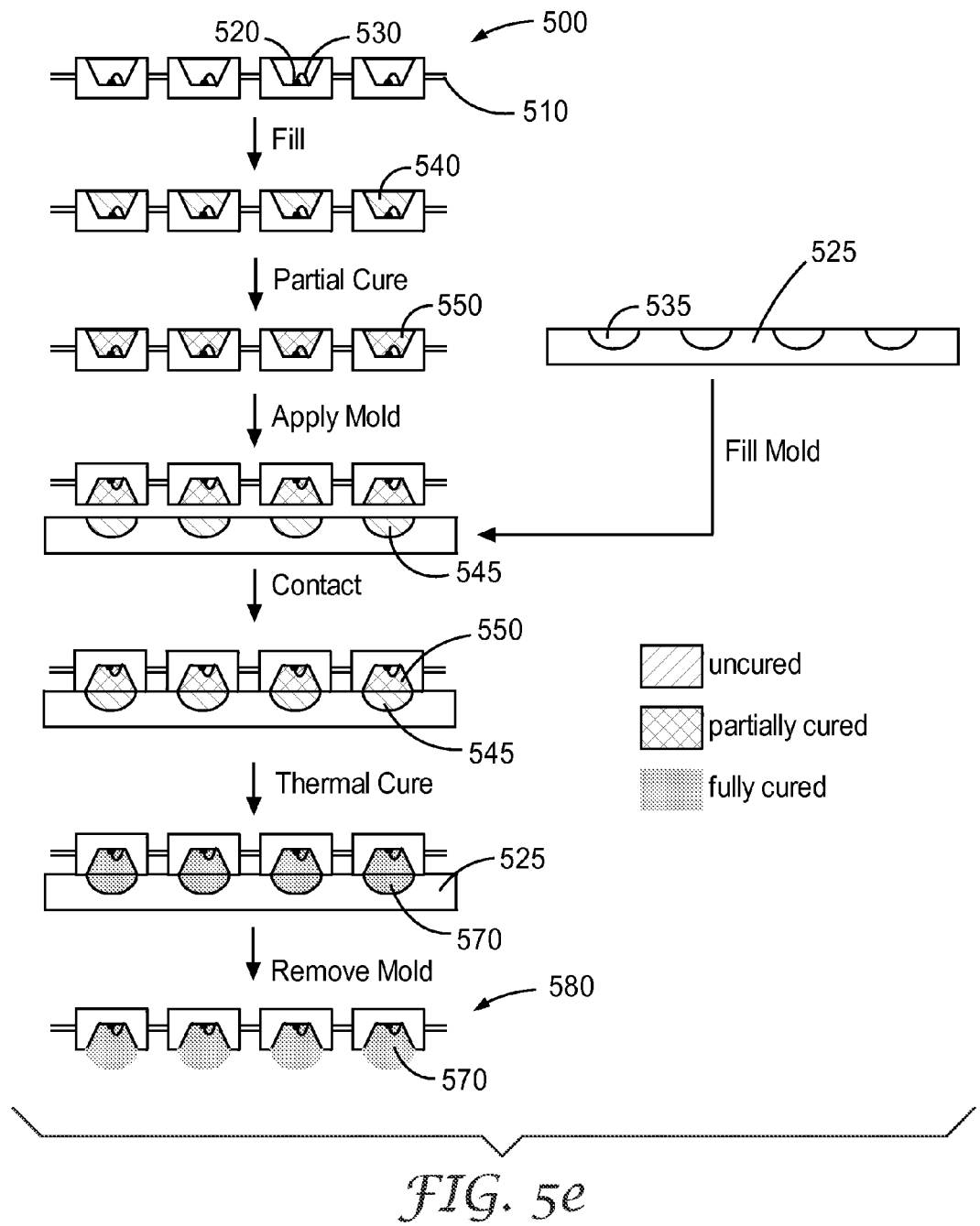

Another embodiment of the molding process is shown in FIG. 5e in a cross sectional perspective. An array of LED packages 500 on a lead frame 510 is provided with an LED die 520 and wire bonds 530 in the packages. The LED packages are filled with an uncured encapsulant resin 540. The uncured encapsulant resin is heated, to at least partially cure the encapsulant resin, producing a partially cured encapsulant resin 550 that has increased in viscosity significantly or has gelled, such that the resin does not flow out of the LED package when the packages on the lead frame are tilted or turned over. The surface of the partially cured encapsulant resin has at least some tackiness or is sticky. To a mold 525 with cavities 535 designed to align with the packages on the lead frame is added uncured lens resin material 545. The array of packages with partially cured encapsulant 550 is aligned with the mold 525 filled with uncured lens resin material 545. The packages are contacted to the mold. The mold package assembly is then heated to finish curing the encapsulant and lens resins to give a single cured encapsulant lens material 570. The mold 525 can optionally be removed to give an array of LED devices with lenses 580.

Figure 5F:
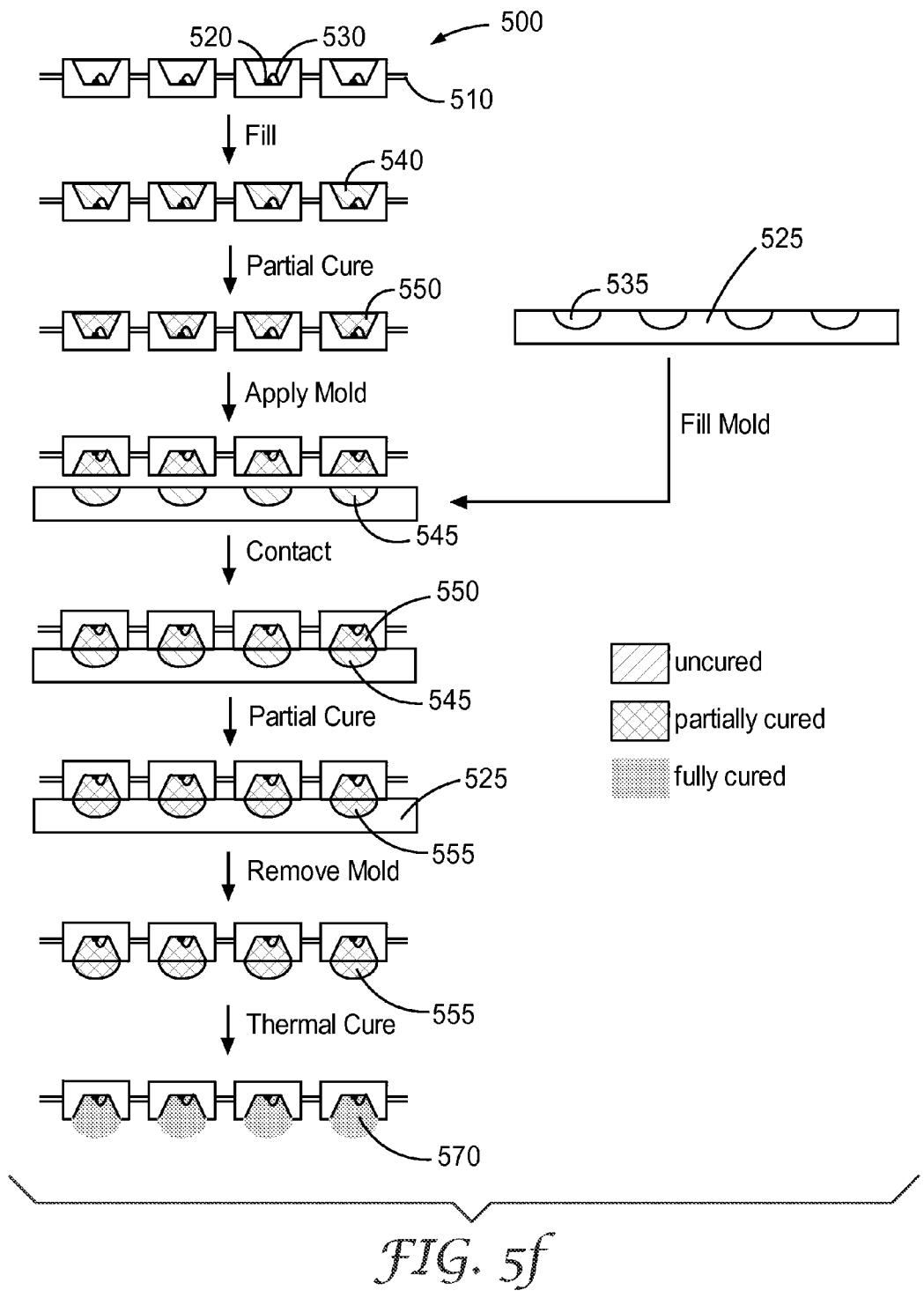

As shown in FIG. 5f, after contacting the LED packages with the mold, the uncured lens resin 545 can be partially cured either with actinic radiation or heat or both actinic radiation and heat, to produce partially cured lens resin 555 inside the mold. Note that if actinic radiation is to be used that the mold material must be transparent to the actinic radiation. If the partially cured lens resin 555 is cured to the point of being tack free on it's surface, the surface that is in contact with the mold 525, the mold 525 can be removed prior to the final heating step.

Figure 5G:
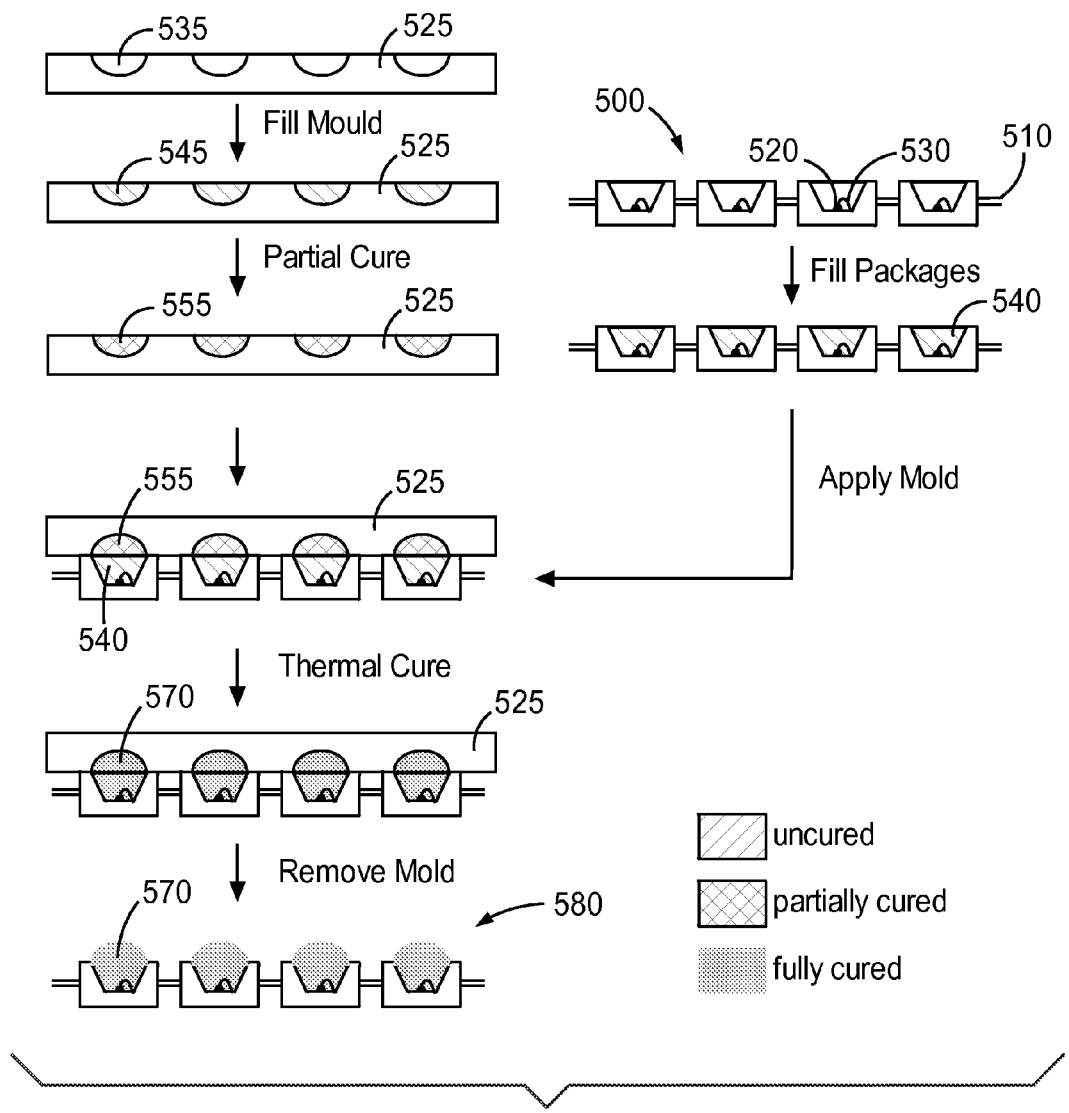

Another embodiment of the molding process is shown in FIG. 5g in a cross sectional perspective and illustrates an alternative process flow. To a mold 525 with cavities 535 designed to align with the packages on a lead frame is added uncured lens resin material 545. The uncured lens resin 545 in the mold can be exposed to either or both actinic radiation and/or heat to produce a partially cured lens resin 555 that has increased in viscosity significantly or has gelled, such that the resin does not flow out of the LED package when the packages on the lead frame are tilted or turned over. The exposed surface of the partially cured lens resin, not in contact with the mold, has at least some tackiness or is sticky. To the LED packages 500 is added an uncured encapsulant resin 540. The mold with the partially cured lens resin 555 is placed in contact with the LED packages containing uncured encapsulant resin 540. The assembly is then heated to finish curing the encapsulant and lens resins to give a single cured encapsulant lens material 570. The mold 525 can optionally be removed to give an array of LED devices with lenses 580.

Figure 5H:
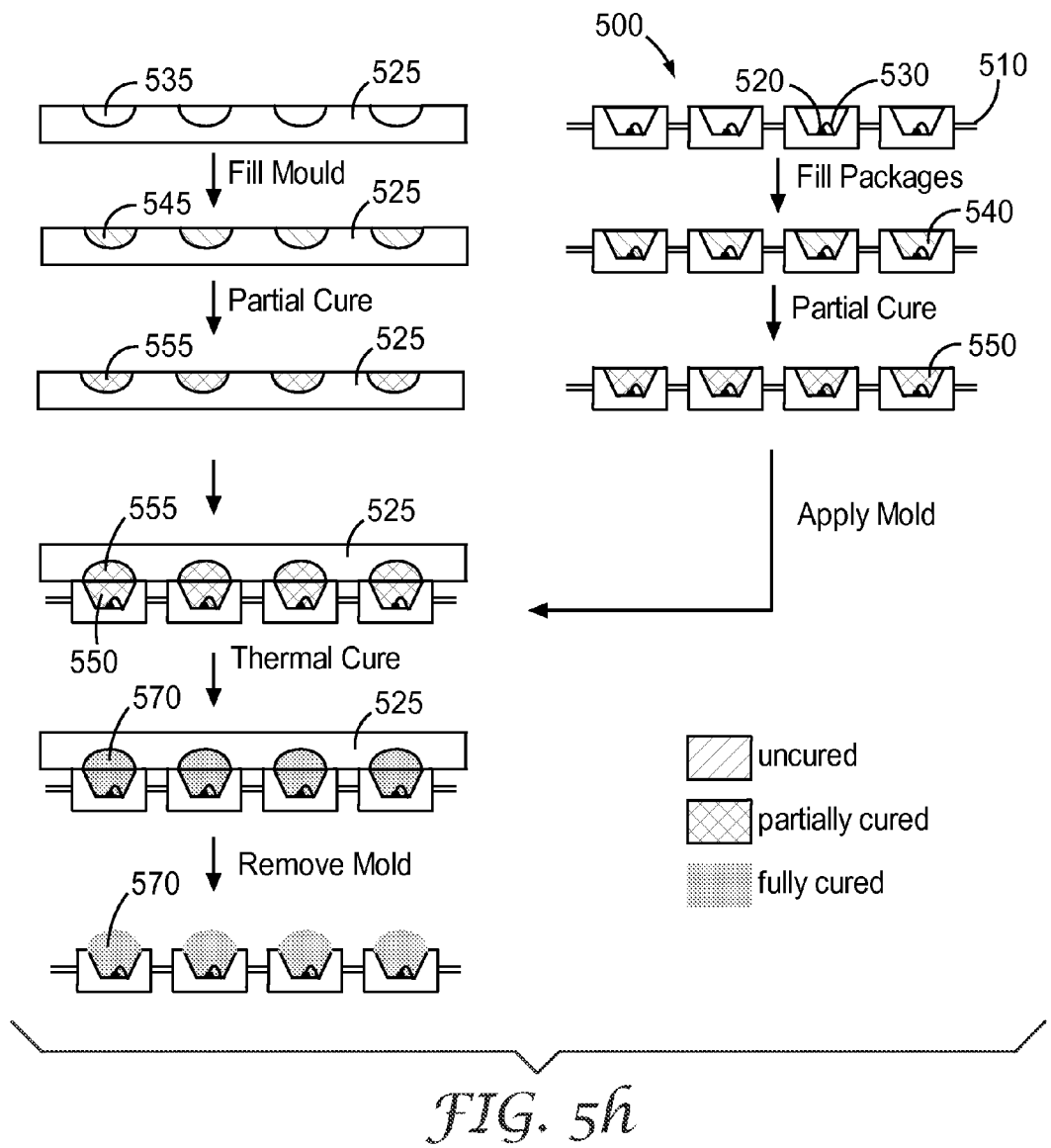

Another embodiment of the molding process is shown in FIG. 5h in a cross sectional perspective. An array of LED packages 500 on a lead frame 510 is provided with an LED die 520 and wire bonds 530 in the packages. The LED packages are filled with an uncured encapsulant resin 540. The uncured encapsulant resin is exposed to heat or a combination of heat and actinic radiation, to at least partially cure the encapsulant resin, producing a partially cured encapsulant resin 550 that has increased in viscosity significantly or has gelled, such that the resin does not flow out of the LED package when the packages on the lead frame are tilted or turned over. The surface of the partially cured encapsulant resin has at least some tackiness or is sticky. To a mold 525 with cavities designed to align with the packages on a lead frame is added uncured lens resin material 545. The uncured lens resin 545 in the mold can be exposed to either or both actinic radiation and/or heat to produce a partially cured lens resin 555 that has increased in viscosity significantly or has gelled, such that the resin does not flow out of the LED package when the packages on the lead frame are tilted or turned over. The exposed surface of the partially cured lens resin, not in contact with the mold, has at least some tackiness or is sticky. The packages and the mold with partially cured encapsulant and lens resins respectively are contacted to one another. The mold package assembly is then heated to finish curing the encapsulant and lens resins to give a single cured encapsulant lens material 570. The mold 525 can optionally be removed to give an array of LED devices with lenses 580.

Figure 5I:
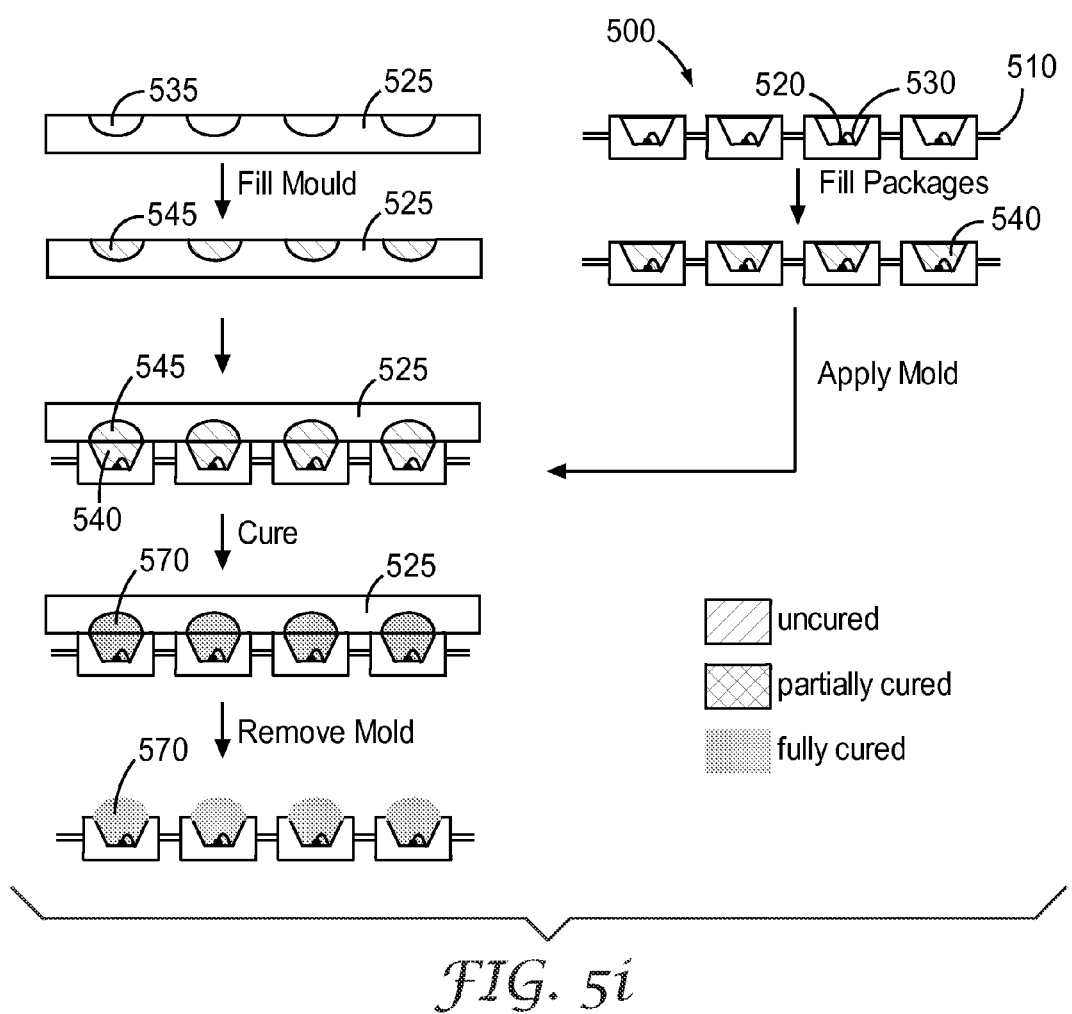

Another embodiment of the molding process is shown in FIG. 5i in a cross sectional perspective. An array of LED packages 500 on a lead frame 510 is provided with an LED die 520 and wire bonds 530 in the packages. The LED packages are filled with an uncured encapsulant resin 540 that is highly thixotropic or viscous such that the uncured encapsulant resin does not flow out of the LED package when the packages on the lead frame are tilted or turned over. The surface of the uncured encapsulant resin has at least some tackiness or is sticky. To a mold 525 with cavities designed to align with the packages on a lead frame is added uncured lens resin material 545, that is highly thixotropic or viscous such that the uncured lens resin 545 does not flow out of the LED package when the packages on the lead frame are tilted or turned over. The exposed surface of the uncured lens resin, not contact the mold, has at least some tackiness or is sticky. The packages and the mold with uncured encapsulant and lens resins respectively are contacted to one another. The mold package assembly is then heated to finish curing the encapsulant and lens resins to give a single cured encapsulant lens material 570. The mold 525 can optionally be removed to give an array of LED devices with lenses 580.

Figure 6:
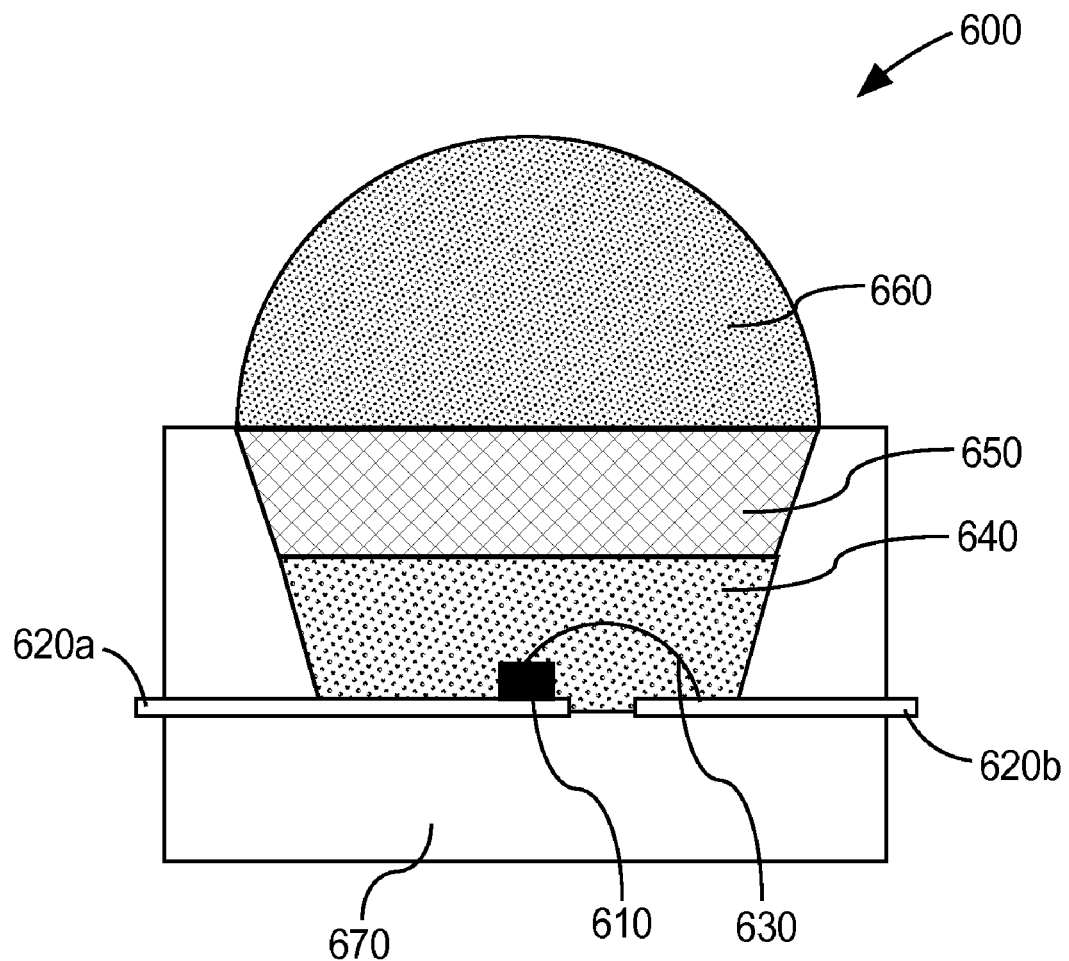
FIG. 6 is a schematic diagram of an LED device according to an embodiment of the present disclosure.

FIG. 6 is a schematic diagram of exemplary LED device 600 with one wire bond 630 bonded to LED die 610. The LED die is connected to electrodes 620a and 620b, which are disposed on substrate 670. As shown in FIG. 6, the process can be modified such that the LED packages may be filled with multiple layers of encapsulant as has been previously described in U.S. Ser. No. 11/741,808 (Thompson et al.). The final LED device 600 can have at least two different resins comprising the layers of the encapsulant lens material 570 from FIGS. 5a-i. Examples of possible cases are: 1. where the cured resin materials 650 and 660 are derived from the same uncured resin material and the cured encapsulant resin 640 is derived from a different uncured resin material. The refractive indexes of all of the resin materials can be substantially the same or the refractive index of the cured encapsulant resin material 640 is higher than resins materials 650 and 660. Additionally, the cured encapsulant resin material 640 may be softer than cured resin materials 650 and 660; 2. where the cured resin materials 640, 650, and 660 are all derived from different uncured resin materials. It may be desirable for the refractive indexes of the three layers to decrease from cured encapsulant resin 640, to cured resin 650, to cured resin 660. It may be also be desirable for cured encapsulant resin 640 to be soft with cured resin materials 650 and 660 being harder and more mechanically robust. It will be appreciated that the FIG. 6 is illustrative only and that there may be more than three layers in the final cured encapsulant lens material.

It will be appreciated that the any of the layers of the resin material described in the preceding text may contain phosphor materials.

What is claimed is:

1. A method of making a light emitting device, the method comprising:
   (a) providing an LED package comprising an LED die disposed in a reflecting cup, the reflecting cup filled with a first polymerizable composition such that the LED die is encapsulated;
   (b) providing a transparent mold having a cavity filled with a second polymerizable composition;
   (c) polymerizing the second polymerizable composition to form a second partially polymerized composition, wherein polymerizing the second polymerizable composition comprises applying actinic radiation having a wavelength of 700 nm or less; and
   (d) inverting the mold to contact the first polymerizable composition and the second partially polymerized composition;
   (e) polymerizing the first polymerizable composition to form a first partially polymerized composition, wherein polymerizing the first polymerizable composition comprises applying actinic radiation having a wavelength of 700 nm or less.

2. The method of claim 1, wherein polymerizing the first polymerizable composition to form a first partially polymerized composition comprises simultaneously heating and applying actinic radiation having a wavelength of 700 nm or less.

3. The method of claim 1, the method further comprising:
   (f) heating the first and second partially polymerized compositions.

4. The method of claim 1, the method further comprising:
   (f) separating the mold from the second partially polymerized composition to form a molded second partially polymerized composition; and
   (g) heating the first partially polymerized composition and the molded second partially polymerized composition.

5. The method of claim 1, wherein providing an LED package comprising an LED die disposed in a reflecting cup comprises providing a plurality of LED packages disposed on a lead frame, each LED package comprising an LED die disposed in a reflecting cup.

6. A method of making a light emitting device, the method comprising:
   (a) providing an LED package comprising an LED die disposed in a reflecting cup, the reflecting cup filled with a first polymerizable composition such that the LED die is encapsulated;
   (b) providing a mold having a cavity filled with a second polymerizable composition;
   (c) polymerizing the second polymerizable composition to form a second partially polymerized composition, wherein polymerizing the second polymerizable composition comprises heating;
   (d) inverting the mold to contact the first polymerizable composition and the second partially polymerized composition; and
   (e) polymerizing the first polymerizable composition to form a first partially polymerized composition, wherein polymerizing the first polymerizable composition comprises heating.

7. The method of claim 6, the method further comprising:
   (f) separating the mold from the second partially polymerized composition to form a molded second partially polymerized composition; and (g) heating the first partially polymerized composition and the molded second partially polymerized composition.

8. The method of claim 6, wherein providing an LED package comprising an LED die disposed in a reflecting cup comprises providing a plurality of LED packages disposed on a lead frame, each LED package comprising an LED die disposed in a reflecting cup.

9. A method of making a light emitting device, the method comprising:
 (a) providing an LED package comprising an LED die disposed in a reflecting cup, the reflecting cup filled with a first polymerizable composition such that the LED die is encapsulated;
 (b) providing a mold having a cavity filled with a second polymerizable composition, and partially polymerizing the second polymerizable composition to form a second partially polymerized composition;
 (c) contacting the first polymerizable composition and the second partially polymerized composition;
 (d) polymerizing the first polymerizable composition and the second partially polymerized composition to form first and second polymerized compositions, respectively, wherein the first and second polymerized compositions are bonded together; and
 (e) optionally separating the mold from the second polymerized composition.

10. The method of claim 9, wherein
contacting the first polymerizable composition and the second partially polymerized composition comprises inverting the mold.

\* \* \* \* \*